United States Patent
Yoneda

(10) Patent No.: US 6,960,890 B2
(45) Date of Patent: Nov. 1, 2005

(54) ELECTROLUMINESCENT DISPLAY DEVICE

(75) Inventor: Kiyoshi Yoneda, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 35 days.

(21) Appl. No.: 10/790,250

(22) Filed: Mar. 2, 2004

(65) Prior Publication Data

US 2004/0217714 A1 Nov. 4, 2004

(30) Foreign Application Priority Data

Mar. 3, 2003 (JP) ........................................ 2003-055335

(51) Int. Cl.$^7$ ............................................... G09G 3/10
(52) U.S. Cl. ................................ 315/169.3; 315/169.1; 315/167; 315/224; 315/291; 345/76; 257/13
(58) Field of Search .......................... 315/169.3, 169.1, 315/224, 167; 345/76; 257/13

(56) References Cited

U.S. PATENT DOCUMENTS

| | | | |
|---|---|---|---|
| 6,204,610 B1 * | 3/2001 | Komiya ................... | 315/169.3 |
| 6,670,637 B2 * | 12/2003 | Yamazaki et al. ............ | 257/59 |
| 2003/0234392 A1 * | 12/2003 | Kung et al. .................... | 257/13 |
| 2004/0036683 A1 * | 2/2004 | Senda ......................... | 345/204 |
| 2004/0196218 A1 * | 10/2004 | Senda et al. .................. | 345/76 |

* cited by examiner

*Primary Examiner*—Don Wong
*Assistant Examiner*—Chuc Tran
(74) *Attorney, Agent, or Firm*—Morrison & Foerster LLP

(57) ABSTRACT

The invention prevents an uneven display on an organic EL display panel by reducing characteristic variation of a driving transistor among pixels. A gate signal line for supplying a gate signal and a drain signal line for supplying a display signal are crossing each other. Four split driving TFTs of P-channel type are provided in a pixel, and drains of the driving TFTs are connected with anodes of split organic EL elements, respectively. A common gate of the driving TFTs is connected with a pixel selecting TFT.

6 Claims, 3 Drawing Sheets ical display device using organic EL elements has been receiving attention as a new display device substituted for a CRT or an LCD. Particularly, an organic EL display device having thin film transistors (hereafter, referred to as TFTs) as switching elements for driving the organic EL elements is being developed.

ELECTROLUMINESCENT DISPLAY DEVICE

BACKGROUND OF THE INVENTION

1. Field of the Invention

The invention relates to an electroluminescent display device, particularly to a display device having a pixel selecting transistor and a driving transistor for current-driving an electroluminescent element.

2. Description of the Related Art

In recent years, an organic electroluminescent (hereafter, referred to as "EL") display device using organic EL elements has been receiving attention as a new display device substituted for a CRT or an LCD. Particularly, an organic EL display device having thin film transistors (hereafter, referred to as TFTs) as switching elements for driving the organic EL elements is being developed.

FIG. 4 is an equivalent circuit diagram of one pixel in an organic EL display panel. In an actual organic EL display panel, a plurality of the pixels is disposed in a matrix of n rows and m columns. A gate signal line 50 for supplying a gate signal Gn and a drain signal line 51 for supplying a display signal Dm intersect each other.

An organic EL element 52, a driving TFT 53 for driving the organic EL element 52, and a pixel selecting TFT 54 for selecting a pixel are disposed on a periphery of an intersection of these signal lines.

A source of the driving TFT 53 is supplied with positive power supply voltage PVdd from a power supply line 55. A drain of the driving TFT 53 is connected with an anode of the organic EL element 52. A cathode of the organic EL element 52 is supplied with negative power supply voltage CV.

A gate of the pixel selecting TFT 54 is connected with the gate signal line 50, and supplied with the gate signal Gn. A drain 54d of the pixel selecting TFT 54 is connected with the drain signal line 51, and supplied with the display signal Dm. A source 54s of the pixel selecting TFT 54 is connected with a gate of the driving TFT 53. The gate signal Gn is outputted from a vertical drive circuit (not shown). The display signal Dm is outputted from a horizontal drive circuit (not shown).

Furthermore, the gate of the driving TFT 53 is connected with a storage capacitor Cs. The storage capacitor Cs stores the display signal Dm for the display pixel for a field period by storing electric charge corresponding to the display signal Dm.

An operation of the EL display device having the described structure is as follows. When the gate signal Gn becomes high for a predetermined horizontal period, the pixel selecting TFT 54 turns on. Then, the display signal Dm is applied from the drain signal line 51 to the gate of the driving TFT 53 through the pixel selecting TFT 54.

According to the display signal Dm supplied to the gate, the conductance of the driving TFT 53 changes. A drive current corresponding to the changed conductance is supplied to the organic EL element 52 through the driving TFT 53, lighting the organic EL element 52. When the driving TFT 53 turns off according to the display signal Dm supplied to the gate, an electric current is not supplied to the driving TFT 53 so that the organic EL element 52 also turns off the light. Such a structure is described, for example, in Japanese Patent Application Publication No. 2002-175029.

However, characteristics of the driving TFT 53, for example, a threshold voltage vary among the pixels depending on manufacturing conditions so that current-drive performance of the driving TFT 53 differs among the pixels. Therefore, a luminance of the organic EL element 52 differs among the pixels, resulting in an uneven display on an organic EL display panel.

SUMMARY OF THE INVENTION

The invention provides an electroluminescent display device that includes a plurality of pixels, a pixel selecting transistor provided for each of the pixels, an electroluminescent element provided for each of the pixels, and a driving transistor provided for each of the pixels and driving a corresponding electroluminescent element in response to a display signal supplied through a corresponding pixel selecting transistor. The driving transistor is split into a plurality of driving transistors, and the electroluminescent element is split into a plurality of electroluminescent elements.

The invention also provides an electroluminescent display device that includes a pixel, a pixel selecting transistor disposed in the pixel, a plurality of electroluminescent elements disposed in the pixel, and a plurality of driving transistors disposed in the pixel and driving the electroluminescent elements in response to a display signal supplied through the pixel selecting transistor. Gates of the driving transistors are connected to a source of the pixel selection transistor, sources of the driving transistors are connected to a power source, and drains of the driving transistors are connected to respective electroluminescent elements.

DESCRIPTION OF THE PREFERRED EMBODIMENT

Figure 1:
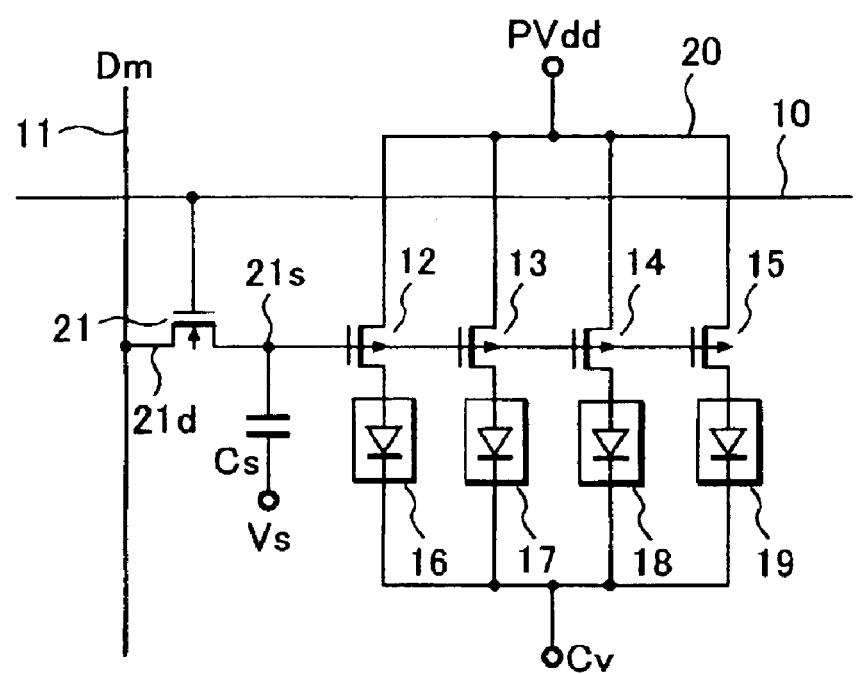
FIG. 1 is an equivalent circuit diagram of an electroluminescent display device of an embodiment of the invention.

Next, an organic EL display device of an embodiment of the invention will be described with reference to the drawings in detail. FIG. 1 is an equivalent circuit diagram of a pixel of the organic EL display device.

A gate signal line 10 for supplying a gate signal Gn and a drain signal line 11 for supplying a display signal Dm intersect each other. Four split driving TFTs 12, 13, 14, and 15 of P-channel type are provided in the pixel, and drains of these driving TFTs 12, 13, 14, and 15 are connected with anodes of four split organic EL elements 16, 17, 18, and 19, respectively. A common source of the driving TFTs 12, 13, 14, and 15 is connected with a power supply line 20 supplied with positive power supply voltage PVdd. The organic EL elements 16, 17, 18, and 19 share a common cathode, and the cathode is supplied with negative power supply voltage CV.

A gate of a pixel selecting TFT 21 of N-channel type is connected with the gate signal line 10, and supplied with the gate signal Gn. A drain 21d of the pixel selecting TFT 21 is connected with the drain signal line 11, and supplied with the display signal Dm. A source 21s of the pixel selecting TFT 21 is commonly connected with gates of the four driving TFTs 12, 13, 14, and 15. The gate signal Gn is outputted from a vertical drive circuit (not shown), and the display signal Dm is outputted from a horizontal drive circuit (not shown).

The common gate of the four driving TFTs 12, 13, 14, and 15 are commonly connected with a storage capacitor Cs. The storage capacitor Cs stores the display signal Dm for the display pixel for a field period by storing electric charge corresponding to the display signal Dm.

In this embodiment, the driving TFT provided in a pixel is split into four. Therefore, even if characteristics of the driving TFTs 12, 13, 14, and 15 vary in the pixel, the variation can be averaged so that characteristic variation of the driving transistor among pixels reduces. For example, even if the threshold voltage of the driving TFT 12 which is one of the split driving TFTs in a pixel becomes high, a luminance of the pixel is determined by all of the other driving TFTs. That is, the driving TFT 13 may have a low threshold voltage to even out the high threshold voltage. Therefore, luminance variation among the pixels is minimized.

Figure 2:
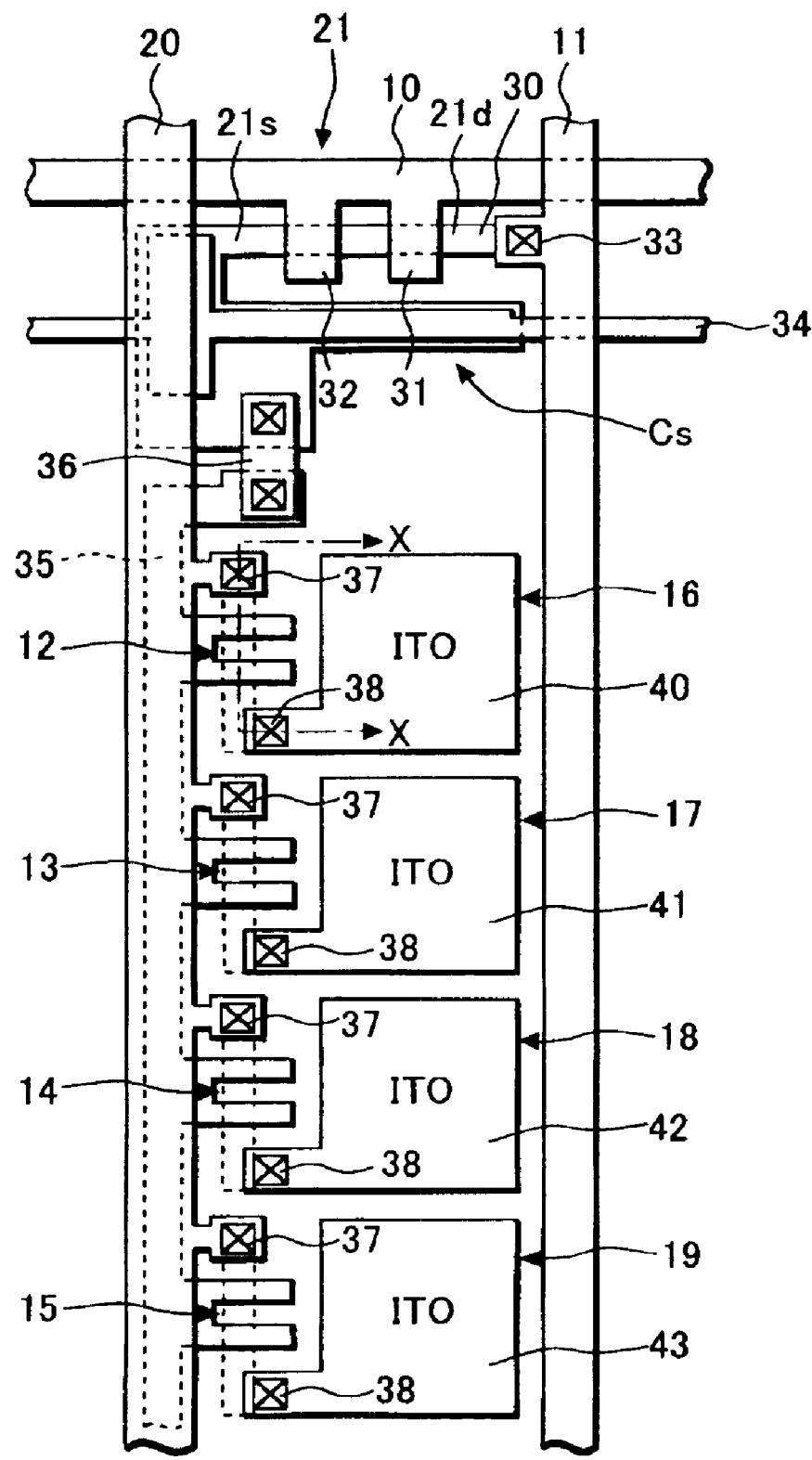
FIG. 2 is a pattern layout of the electroluminescent display device of the embodiment of the invention.
Figure 3:
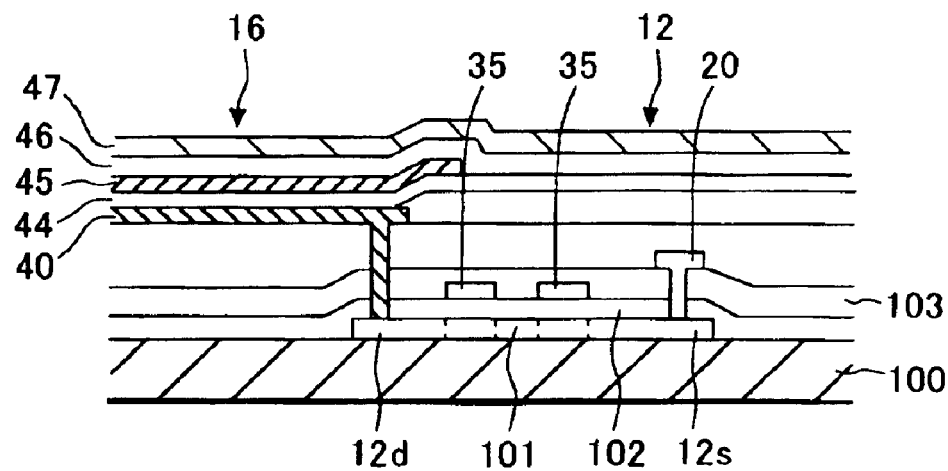
FIG. 3 is a cross-sectional view along line X—X of FIG. 2.
Figure 4:
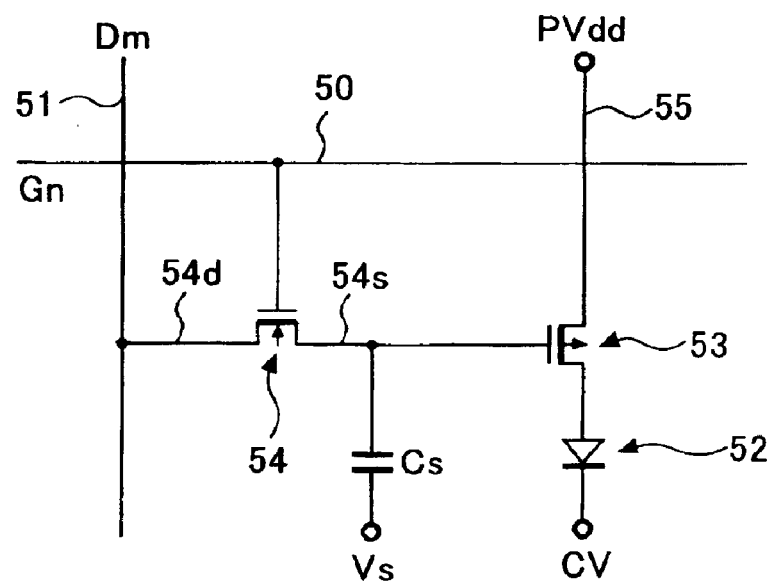
FIG. 4 is an equivalent circuit diagram of an electroluminescent display device of a conventional art.

FIG. 2 is a pattern layout (plan view) of a pixel of the above organic EL display device. FIG. 3 is a cross-sectional view along line X—X of FIG. 2.

The gate signal line 10 for supplying the gate signal Gn extends in a row direction, and the drain signal line 11 for supplying the display signal Dm extends in a column direction. These signal lines intersect each other. The gate signal line 10 is made of a Cr (chromium) layer or an Mo (molybdenum) layer. The drain signal line 11 is made of an Al (aluminum) layer, being formed above the gate signal line 10.

The pixel selecting TFT 21 is formed of a polysilicon TFT. This pixel selecting TFT 21 has a double gate structure, in which a gate insulating layer (not shown) is formed on an active layer 30 made of a polysilicon layer which is formed on a transparent insulating substrate 100 made of a glass substrate, and two gates 31 and 32 extending from the gate signal line 10 are formed on the gate insulating layer.

A drain 21d of the pixel selecting TFT 21 is connected with the drain signal line 11 through a contact 33. A polysilicon layer forming a source 21s of the pixel selecting TFT 21 extends over a storage capacitor region, and a storage capacitor line 34 thereon overlaps the source 21s through a capacitor insulating film. This overlapping portion forms a storage capacitor Cs.

The polysilicon layer extending from the source 21s of the pixel selecting TFT 21 is commonly connected with a common gate 35 of the four driving TFTs 12, 13, 14, and 15 through Al wiring 36.

The four driving TFTs 12, 13, 14, and 15 are formed of a polysilicon TFT. A gate insulating layer 102 is formed on an active layer 101 made of a polysilicon layer which is formed on a transparent insulating substrate 100 made of a glass substrate. The common gate 35 made of a Cr layer or an Mo layer is formed on the gate insulating layer 102. An interlayer insulating layer 103 is formed on the common gate 35.

The sources of the driving TFT 12, 13, 14, and 15 are commonly connected with the power supply line 20 supplied with positive power supply voltage PVdd through contacts 37 For example, a source 12s of the driving TFT 12 is connected with the power supply line 20. The drains of the driving TFT 12, 13, 14, and 15 are connected with anodes 40, 41, 42, and 43 of the organic EL elements 16, 17, 18, and 19, respectively. The anodes 40, 41, 42, and 43 are made of ITO (indium tin oxide) and provided as individual device components.

For example, a drain 12d of the driving TFT 12 is connected with the anode 40 of the organic EL element 16 through a contact 38. A hole transport layer 44, an emissive layer 45, and an electron transport layer 46 are laminated on the anode 40, and a cathode 47 is further formed thereon. The cathode 47 is shared by the organic EL elements 16, 17, 18, and 19.

Although the driving TFT and the organic EL element are each split into four components, they may be split into a different number if necessary. Furthermore, although a pixel area increases by splitting the driving TFT and the organic EL element, the pixel area is reduced by developing finer pixel elements.

What is claimed is:

1. An electroluminescent display device comprising:
   a plurality of pixels;
   a pixel selecting transistor provided for each of the pixels;
   an electroluminescent element provided for each of the pixels; and
   a driving transistor provided for each of the pixels and driving a corresponding electroluminescent element in response to a display signal supplied through a corresponding pixel selecting transistor,
   wherein the driving transistor is split into a plurality of driving transistors, and the electroluminescent element is split into a plurality of electroluminescent elements.

2. The electroluminescent display device of claim 1, wherein the number of the split driving transistors in a pixel is equal to the number of the split electroluminescent elements in the same pixel.

3. The electroluminescent display device of claim 1, wherein an anode of the electroluminescent element is split into a plurality of anodes, and the number of the split anodes in a pixel is equal to the number of the split driving transistors in the same pixel.

4. The electroluminescent display device of claim 1, wherein the number of the split driving transistors in a pixel is four.

5. The electroluminescent display device of claim 3, wherein the number of the split driving transistors in a pixel is four.

6. An electroluminescent display device comprising:
   a pixel;
   a pixel selecting transistor disposed in the pixel;
   a plurality of electroluminescent elements disposed in the pixel; and
   a plurality of driving transistors disposed in the pixel and driving the electroluminescent elements in response to a display signal supplied through the pixel selecting transistor,
   wherein gates of the driving transistors are connected to a source of the pixel selecting transistor, sources of the driving transistors are connected to a power source, and drains of the driving transistors are connected to respective electroluminescent elements.

* * * * *